FABRICATION OF BEAM LEAD SEMICONDUCTOR DEVICES

Filed Dec. 7, 1965 4 Sheets-Sheet 1

INVENTOR
J. M. SZABO, JR.
BY H W Lockhart
ATTORNEY

June 11, 1968 J. M. SZABO, JR 3,388,048

FABRICATION OF BEAM LEAD SEMICONDUCTOR DEVICES

Filed Dec. 7, 1965 4 Sheets-Sheet 3

3,388,048

FABRICATION OF BEAM LEAD SEMICONDUCTOR DEVICES

Joseph M. Szabo, Jr., Allentown, Pa., assignor to Bell Telephone Laboratories, Incorporated, New York, N.Y., a corporation of New York Filed Dec. 7, 1965, Ser. No. 512,045
7 Claims. (Cl. 204—15)

This invention relates to semiconductor devices and particularly to improved methods of fabricating semiconductor devices of the beam lead type.

The applications of M. P. Lepselter, Ser. No. 331,168, filed Dec. 17, 1963 and now Patent No. 3,287,612; Ser. No. 388,039, filed Aug. 7, 1964, now Patent No. 3,335,338, and assigned to the same assignee as this application, disclosed structures and methods of making the same, which have been entitled beam lead semiconductor devices. In general, the above-noted applications disclose the formation of multi-metal layers on selected areas of the surfaces of semiconductor elements to produce electrical contacts thereto and particularly to form relatively thick metal tabs or flaps which have been termed beam leads. These beam leads are produced by the removal of the semiconductor material which underlies the thick deposited metal layers. In the case of single device elements, such as single transistors and diodes in particular, these beam leads provide a convenient member for handling the element as well as for easy interconnection with external leads associated with the package in which the device is assembled. In the case of integrated circuit semiconductor devices, beam leads provide structural support and enable the removal of material between elements or groups of circuit elements to provide complete isolation therebetween. Devices of this type have been termed isoliths.

An object of this invention is improved methods for making semiconductor devices of the beam lead type.

In particular an object is to simplify the method of making semiconductor devices of the beam lead type by reducing the number of masking steps generally employed in prior techniques.

A further object is to avoid the use of cathodic back-sputtering during the device fabrication.

In accordance with the invention, it has been found that, following the deposition of the first two metal layers, specifically titanium and platinum, the final metallic pattern may be delineated in the platinum layer by a photolithographic etching process in place of the back-sputtering technique of the above-noted Lepselter disclosures. This chemical etching process has been found to produce good definition in the relatively thin uppermost layer of platinum.

Having thus defined the final metal pattern in the platinum layer, two major alternatives are available to exploit this advantageous photo-etching technique. In accordance with one alternative a thin layer of gold is deposited over the entire surface of the plated semiconductor body. This layer coats both the platinum pattern and the exposed titanium layer. This gold overlayer then is confined to the platinum areas by the simple expedient of applying a pressure liquid spray to the surface. This pressure treatment utilizes the difference in adherence exhibited by the gold on titanium and on platinum. Adherence on platinum is relatively good, but poor on the titanium. Thus, the result is a thin gold layer restricted to the already delineated platinum metal pattern. This process may be repeated in order to increase the thickness of the gold layer to that required in the completed device. A subsequent processing step using a chemical etch removes the exposed titanium layer leaving the standard contact and beam lead pattern comprising the multi-metal layer of gold, platinum and titanium.

The other alternative involves a maskless electroplating process which follows the chemical etching treatment to remove the exposed titanium. In accordance with this aspect of the invention, the contact and beam lead patterns are made so as to interconnect, during the fabrication process only, the emitter, base and collector zones of the transistor, or in effect, all of the zones separated by PN junction barriers from the conductivity type zone which forms the underside or major portion of the element. The purpose of this procedure is to electrically interconnect all of the conductivity type zones upon which metal contact layers are to be fabricated. Then, the semiconductor element having the metal contact and beam lead pattern defined thereon in a titanium-platinum layer is immersed in an electroplating solution using a gold compound as the electrolyte. This step produces a gold layer on top of only the metal contact and beam lead pattern. This layer may be deposited to a considerable thickness and with a very excellent degree of definition. Having thus formed the contact and beam lead structure, the electrical interconnections between the conductivity type zones are removed by the removal of underlying semiconductor material in the course of fabricating the over-hanging beam leads.

It will be noted that in the foregoing described techniques, only one photoresistant etching step is called for and the re-registration of masks thus is eliminated during subsequent processing.

In a further alternative to the electroplating technique to fabricate the gold layer, a desirable differential thickness in the contact and beam lead pattern is attained by providing narrow gaps in the metal patterns as initially formed in the titanium and platinum. During the electroplating process gold metal is deposited initially only on those portions which are electrically interconnected with the back electrode until the gaps provided have been "bridged" by the depositing gold. Subsequent to the bridging of these gaps the gold plates on the entire metal pattern. Accordingly, by this technique the gold on the beam lead portions conveniently is provided with a greater thickness than that on the contact portions of the devices.

The invention, its features and other objects will be more clearly understood from the following more detailed description taken in conjunction with the drawings in which.

Figure 9:
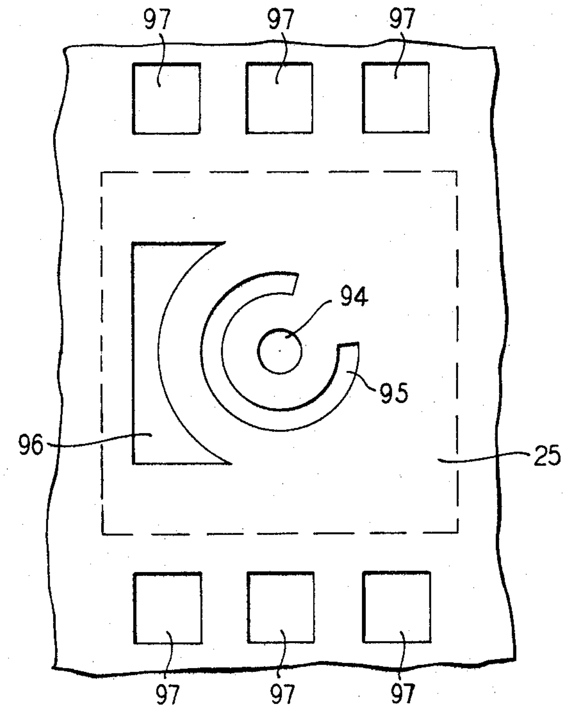
FIGS. 9 and 10 are plan views of a portion of the semiconductor element at points in the fabrication process.

Referring to the block diagram of FIG. 1, the initial steps in the process are similar to those described in connection with the above-noted applications of Lepselter. In particular, a body of silicon semiconductor material, is treated in accordance with procedures now well-known in the art to produce a plurality of zones of d'ffering conductivity-type defining PN junctions therebetween generally utilizing the technique of oxide masking and solid state diffusion. Referring also to FIG. 2 only a portion of a semiconductor body containing three zones is shown for illustrative purposes. In a body of N-type silicon 20, which ultimately forms the collector zone of a transistor, successive diffusions produce a P-type base zone 21 and an N-type emitter zone 22. These three zones define PN junctions 23 and 24 therebetween. On the upper face of the body, which is intersected by the boundaries of the PN junctions 23 and 24 and is thus termed a planar device, there is formed a layer 25 of silicon oxide in which the openings therethrough define the areas wherein electrical contact is to be made to the several zones 20, 21 and 22. A plan view of the oxide mask is shown in FIG. 9. The central circular opening 94 defines the emitter contact and the C-shaped cutout 95, the base contact area. The crescent-shaped cutout 96 defines the collector contact area. The square cutouts 97 adjoining the central pattern on both sides are the contact areas provided for electrically interconnecting the collector zone and the emitter and base zones for the electroplating alternative to be described hereinafter. Thus, the plan view of FIG. 9 corresponds to the structure depicted also in sectional view in FIG. 2.

As is disclosed in the foregoing applications of Lepselter, a first complete layer 26 of titanium metal is deposited on this oxide masked surface 25. Previous to this titanium deposition step a very thin platinum layer may be deposited and sintered to the silicon body to initiate the formation of good ohmic electrical connection. Details of this procedure are disclosed in M. P. Lepselter application Ser. No. 440,782, filed Mar. 18, 1965, now Patent No. 3,274,670, and assigned to the same assignee as this application.

Following the formation of the titanium layer 26, a second metal layer 27 of platinum is deposited over the titanium surface (Block II). Next, as stated in Block III and as shown in FIG. 4, a photoresist pattern 28, corresponding to the desired final contact and beam lead configuration, is produced on the upper surface of the platinum layer 27.

Figure 4:
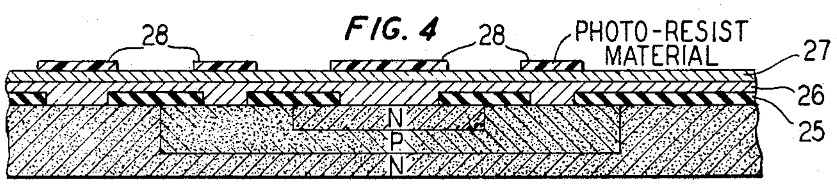
Figure 10:
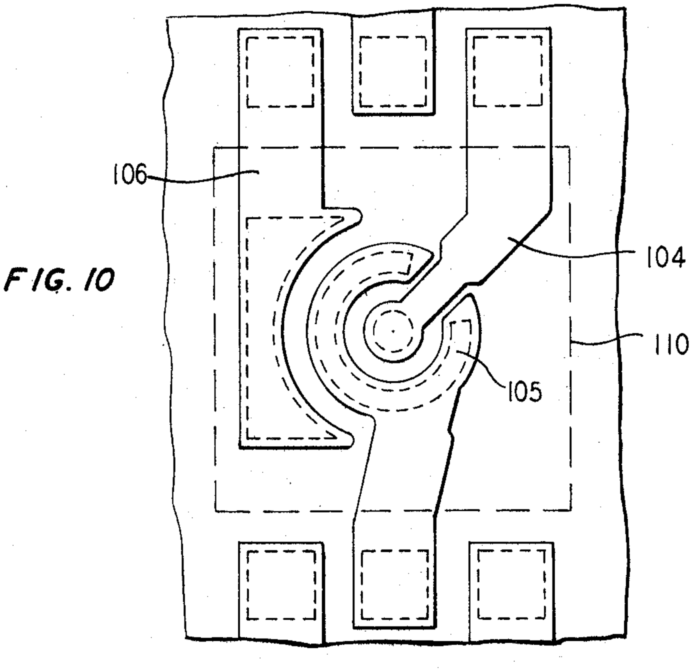

In the plan view of FIG. 10, the photoresist pattern has been formed corresponding to that shown in cross-sectional view of FIG. 4. Thus the area 104 is the emitter contact and beam lead and the area 105 is the base contact and beam lead. Correspondingly, the portion 106 is the collector contact and lead. These areas 104, 105 and 106 represent developed areas of photoresist material while the remainder of the surface is the exposed platinum layer 27.

Figure 1:
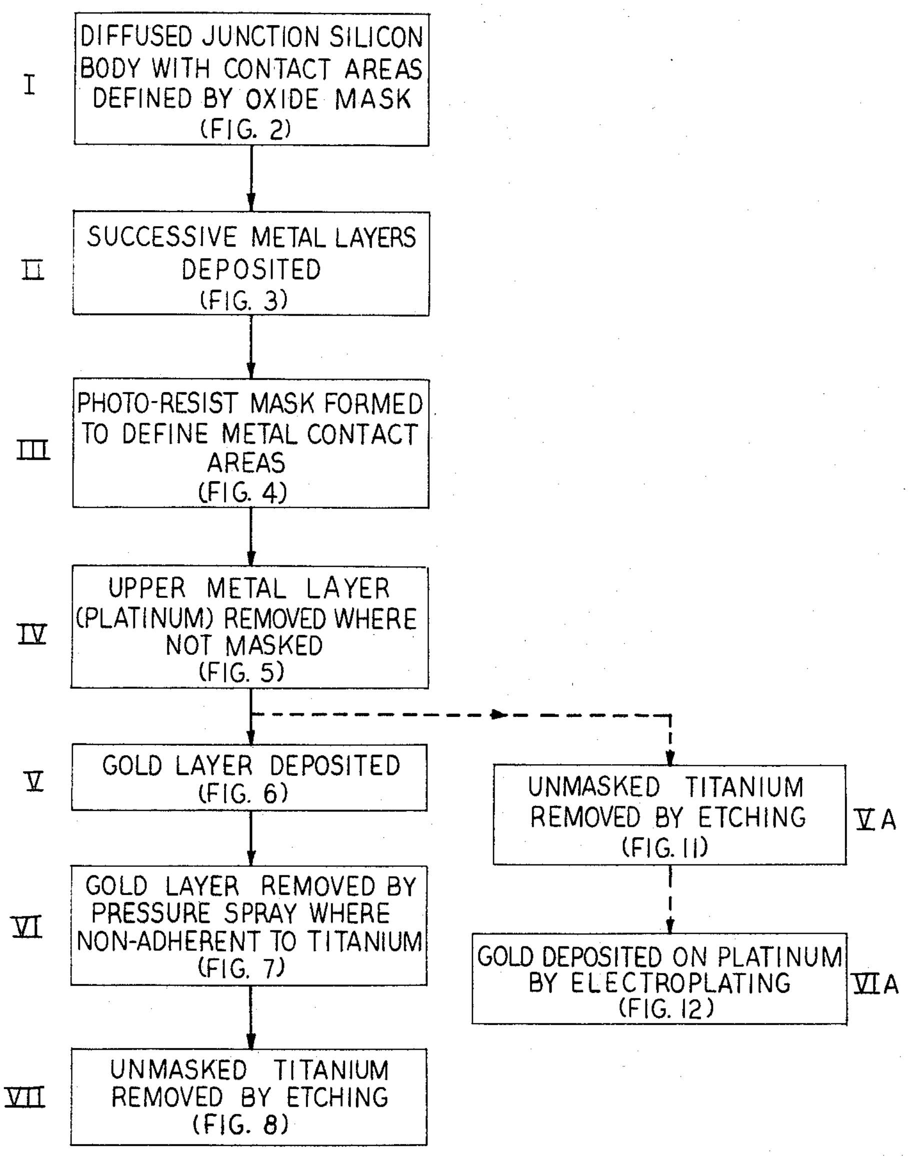
FIG. 1 is a block diagram of the process in its alternative forms in accordance with this invention.
Figure 2:
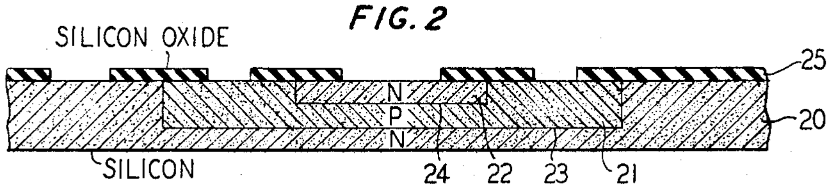
FIGS. 2 through 8 are cross-sectional views of a portion of a semiconductor element illustrating the basic steps of the first alternative in accordance with this invention.
Figure 3:
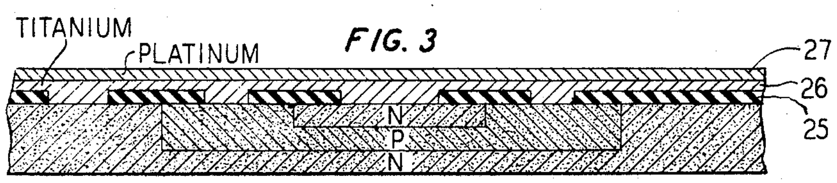
Figure 5:
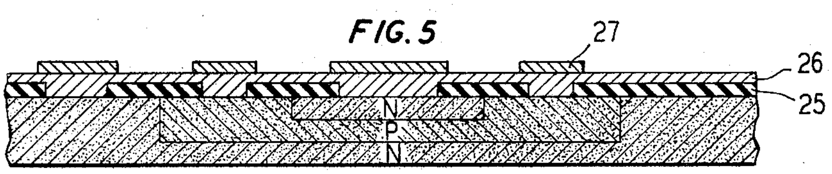

The next step as stated in Block IV of FIG. 1 and depicted in FIG. 5 is the removal of unmasked portions of the platinum layer 27. In particular, this step is accomplished by the use of an etchant comprising a mixture of hydrochloric acid and nitric acid. One particularly useful solution is a mixture of five parts of hydrochloric acid (37 percent concentration), to one part of nitric acid (70 percent concentration) at about seventy degrees centigrade. The removal of platinum may be monitored visually and begins approximately one and one-half minutes after the body is immersed. The removal of platinum may be observed by the change in color exhibited by the unmasked portions. For the thicknesses of metals specified, about 1500 Angstroms, it is usually complete in from two to two and one-half minutes. These slices, rinsed and dried after their removal from the etching solution and after removal of the photoresist mask, have the appearance shown in FIG. 5.

Figure 6:
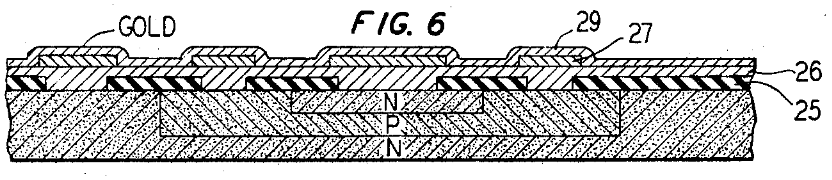
Figure 7:
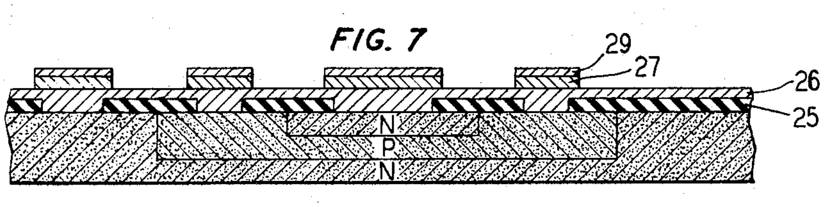

In accordance with the first alternative, as stated in Block V of FIG. 1 and shown in FIG. 6, a layer of gold having a thickness of about 2000 Angstroms is deposited on the entire metallized surface. This gold layer 29 exhibits a differential adherence on platinum as compared to titanium and consequently as stated in Block 6 of FIG. 1 the gold on top of the titanium layer 26 is readily removed by subjecting the surface to a water spray at about eighty pounds per square inch pressure. The semiconductor element then has the appearance shown in FIG. 7. If desired, the gold layer may be built up to a greater thickness by repetition of this technique depositing about 2000 Angstroms of gold in each operation. However, the beam lead portions, having a thickness of about twelve microns (120,000 Angstroms) are most advantageously formed by a separate masking and deposition process as disclosed in the above-noted applications of M. P. Lepselter. The masking step in this case is much less demanding from the standpoint of preciseness, however, and thus the overall process constitutes a considerable improvement. Finally, the exposed titanium layer 26 is removed as shown in FIG. 8 and described in Block VII of FIG. 1 by an etching procedure using an etching solution exemplified by the following solution:

69 cubic centimeters sulphuric acid,
30 cubic centimeters water,
1 cubic centimeter hydrofluoric acid.

Figure 8:
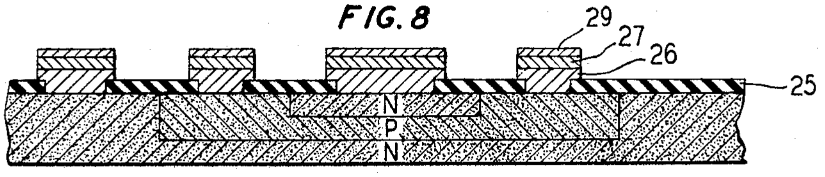

The patterns of the contact and beam lead areas of FIG. 8 will correspond in plan view to the illustration in FIG. 10 with the understanding that the areas 104, 105 and 106 now are multi-metal layers of gold, platinum and titanium. Finally, as disclosed also by Lepselter in his applications noted above, masked etching procedures are used to remove the semiconductor material between elements and underlying the beam lead portions. Specifically referring to FIG. 10 the final transistor comprises the semiconductor wafer defined by the broken line 110 with the extending beam lead portions of the areas 104, 105 and 106.

Figure 11:
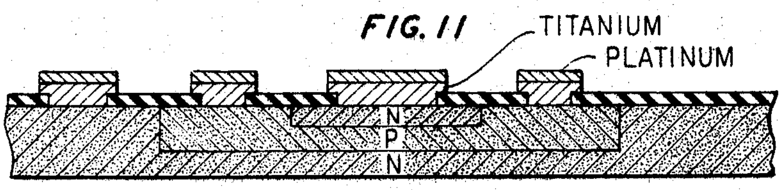
FIGS. 11 and 12 are sectional views illustrating the second alternative procedure utilizing electroplating.
Figure 12:
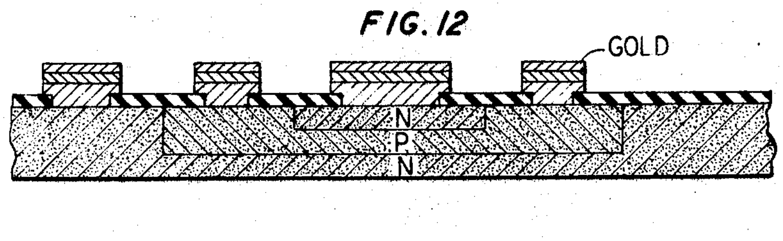

In the alternative procedure, in accordance with this invention, after the unmasked portions of the platinum layer 27 have been removed as stated in Block IV of FIG. 1 by the chemical etching process, the unmasked titanium layer 26 is similarly removed by etching as indicated in Block V–A of FIG. 1. This is accomplished by the etching solution suggested above as step VII of the first alternative. The appearance of the element in cross section at this juncture is illustrated in FIG. 11 and in plan view in FIG. 10. At this point the element is immersed in a gold plating solution and connection is made to the lower N side or collector region. As can be seen by referring to FIG. 10, this N zone 20 is electrically interconnected through the contacts in the rectangular areas 97 to both emitter and base zones 22 and 21, respectively. Consequently, the electroplating process results in a selective plating of gold on the platinum-titanium pattern already present. This technique conveniently enables deposition of gold to a relatively great thickness as required by the beam lead configuration. Upon the termination of this step as set forth in Block VI–A of FIG. 1, the fabrication of the element is completed as shown in the case of the previously recited procedure by etching away the excess semiconductor material which also removes the electrical interconnection between emitter, base and collector zones.

In a further alternative to the latter electroplating technique, differential plating of gold is accomplished by fabricating the platinum-titanium patterns with narrow gaps in the pattern at the locations where a difference in gold thickness is to be defined. In particular, only a relatively thin gold layer is needed over the emitter and base contact areas proper and thus the gaps 136 and 137 are provided in the patterns. During the electroplating process, gold deposits initially only on the outlying portions of the emitter and base beam leads because the inner portions are not electrically connected. However, devices with shorted PN junctions will plate equally on all portions, thus giving a visual indication. During the deposition, the gold bridges the gaps and plating then ensues upon the emitter and base contact areas.

Figures 13, 14:
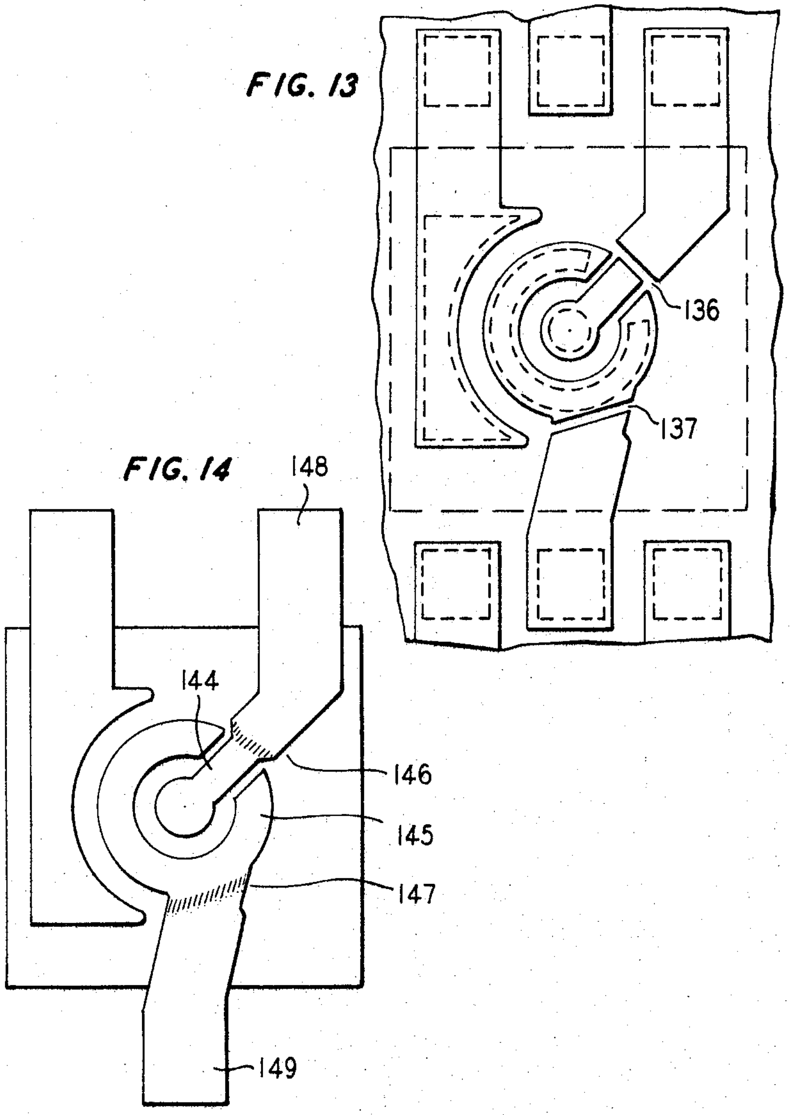
FIGS. 13 and 14 are plan views of device elements utilizing this second alternative.

The final device structure has an appearance somewhat as shown in FIG. 14 in which the shaded areas 146 and 147 represent a change in the thickness of the gold layer from the thinly plated emitter contact area 144 and base contact area 145 to the beam leads 148 and 149. It will be appreciated that the gaps may be provided in narrow multiples to avoid bridging in less than the desired time, or failure to bridge because of imprecise boundaries in the underlying metal patterns. It will be apparent that the difference in thickness in the gold layers is substantially equal to the total gap provided.

In connection with the foregoing described procedures, it will be noted that subsequent to the photoresist process of Block III of FIG. 1, which results in defining the metal contact areas, no further masking operations are required and there is thus a considerable simplification of the fabrication process. Moreover, the platinum etching operation using the photoresist technique has been found to provide a preciseness of definition which is carried forward in the process by the subsequent maskless plating operations so as to produce a product of highly uniform and precise contact and beam lead definition.

Although the process has been described in certain specific embodiments, it will be appreciated that other arrangements may be devised by those skilled in the art which likewise will fall within the scope and spirit of the invention.

What is claimed is:

1. In the fabrication of a beam lead semiconductor device which includes the steps of depositing a first layer of titanium and a second layer of platinum, the step of forming a mask on said platinum layer conforming to the desired contact and beam lead pattern, then treating the masked surface with an etchant to remove the unmasked platinum layer, and electroplating a layer of gold only on said platinum layer.

2. The method in accordance with claim 1 in which the gold layer is formed by, subsequent to the removal of the unmasked platinum layer, the step of removing the unmasked titanium layer and electroplating gold only on said platinum layer.

3. The method in accordance with claim 2 which includes the step of providing electrical interconnection between separated portions of said contact and beam lead pattern.

4. The method in accordance with claim 3 which includes the step of providing gaps in the contact beam lead pattern of platinum and titanium and causing electroplating to proceed initially on portions of the pattern on one side of the gaps to produce a differential plating thickness of gold over said pattern.

5. The method in accordance with claim 1 in which subsequent to the removal of said unmasked platinum layer a layer of gold is deposited on the entire surface and then is removed by a pressure spray from the nonadherent portion overlying the unmasked titanium, and etching to remove the unmasked titanium.

6. The method in accordance with claim 5 in which the pressure spray is water at about eighty pounds per square inch.

7. The method in accordance with claim 1 in which the unmasked platinum layer is removed using an etchant including hydrochloric acid and nitric acid.

References Cited

UNITED STATES PATENTS

| | | | |
|---|---|---|---|
| 3,274,670 | 9/1966 | Lepselter | 29—578 |
| 3,287,612 | 11/1966 | Lepselter | 317—235 |
| 3,325,379 | 6/1967 | Bussolini et al. | 204—15 |
| 3,335,338 | 8/1967 | Lepselter | 317—234 |

JOHN H. MACK, *Primary Examiner.*

T. TUFARIELLO, *Assistant Examiner.*